United States Patent
Kikuchi et al.

(10) Patent No.: US 10,707,675 B2
(45) Date of Patent: Jul. 7, 2020

(54) ELECTRIC-WIRE PROTECTION DEVICE

(71) Applicants: Yazaki Corporation, Tokyo (JP);
HONDA MOTOR CO., LTD., Tokyo (JP)

(72) Inventors: Takashi Kikuchi, Shizuoka (JP);
Keisuke Ueta, Shizuoka (JP);
Syunsuke Nagakura, Shizuoka (JP);
Takahiro Miyakawa, Shizuoka (JP);
Tomoya Nishino, Saitama (JP); Noboru Ujigawa, Saitama (JP); Seiju Kawamata, Saitama (JP); Masataka Tsukioka, Saitama (JP); Rikuya Ezoe, Saitama (JP)

(73) Assignees: YAZAKI CORPORATION,
Minato-ku, Tokyo (JP); HONDA MOTOR CO., LTD., Minato-ku, Tokyo (JP)

( * ) Notice: Subject to any disclaimer, the term of this patent is extended or adjusted under 35 U.S.C. 154(b) by 337 days.

(21) Appl. No.: 15/911,445

(22) Filed: Mar. 5, 2018

(65) Prior Publication Data
US 2018/0261996 A1     Sep. 13, 2018

(30) Foreign Application Priority Data

Mar. 13, 2017 (JP) .................. 2017-047362

(51) Int. Cl.
*H02H 5/04* (2006.01)
*G01K 3/00* (2006.01)
(Continued)

(52) U.S. Cl.
CPC .............. *H02H 5/04* (2013.01); *G01K 3/005* (2013.01); *G01K 7/42* (2013.01); *G01R 19/0092* (2013.01);
(Continued)

(58) Field of Classification Search
CPC ............. H02H 5/04; G01K 3/005; G01K 7/42
See application file for complete search history.

(56) References Cited

U.S. PATENT DOCUMENTS

2007/0253132 A1    11/2007  Nakamura et al.
2010/0254059 A1*  10/2010  Higuchi ................. G01K 3/005
                                                                  361/103

(Continued)

FOREIGN PATENT DOCUMENTS

JP            2007-295776 A         11/2007

*Primary Examiner* — Scott Bauer
(74) *Attorney, Agent, or Firm* — Sughrue Mion PLLC

(57) ABSTRACT

An electric-wire protection device includes a voltage adjustment unit that adjusts the voltage to a load, and a controller that includes a temperature calculation unit that calculates temperature information on an electric wire from a value of current, and makes the voltage adjustment unit into a shut-off state based on the temperature information. The temperature information is calculated from an amount of temperature changes based on the current value and a predetermined initial value. The controller shifts into a sleep state when a sleep condition is satisfied that includes a condition that the temperature information is lower than the initial value. The initial value when the controller returns from the sleep state is based on a convergence value of temperature in conducting energization on the electric wire at a maximum value of steady-state current.

2 Claims, 5 Drawing Sheets

(51) Int. Cl.
*G01K 7/42* (2006.01)
*H02H 3/08* (2006.01)
*H02H 6/00* (2006.01)
*G01R 19/00* (2006.01)
*H02H 7/22* (2006.01)
*H02H 7/26* (2006.01)
*H01H 11/00* (2006.01)

(52) U.S. Cl.
CPC ............ *H02H 3/08* (2013.01); *H02H 6/00* (2013.01); *H02H 6/005* (2013.01); *H02H 7/226* (2013.01); *H01H 2011/0068* (2013.01); *H02H 7/268* (2013.01)

(56) References Cited

U.S. PATENT DOCUMENTS

| | | | | |
|---|---|---|---|---|
| 2013/0293004 | A1* | 11/2013 | Higuchi | H02M 3/156 307/9.1 |
| 2015/0116883 | A1* | 4/2015 | Kimoto | B60R 16/02 361/103 |
| 2017/0294774 | A1* | 10/2017 | Illing | H02H 6/005 |
| 2017/0294918 | A1* | 10/2017 | Illing | H02H 3/38 |
| 2018/0248354 | A1* | 8/2018 | Sugisawa | H02H 3/087 |
| 2019/0260200 | A1* | 8/2019 | Sawano | H02M 1/32 |

\* cited by examiner

FIG.2

| SW | ESTIMATED TEMPERATURE Tw | SHUT-OFF DETERMINATION |
|---|---|---|
| ON | HI | ON |
| ON | LOW | OFF |
| OFF | HI | MAINTAIN VALUE |
| OFF | LOW | MAINTAIN VALUE |

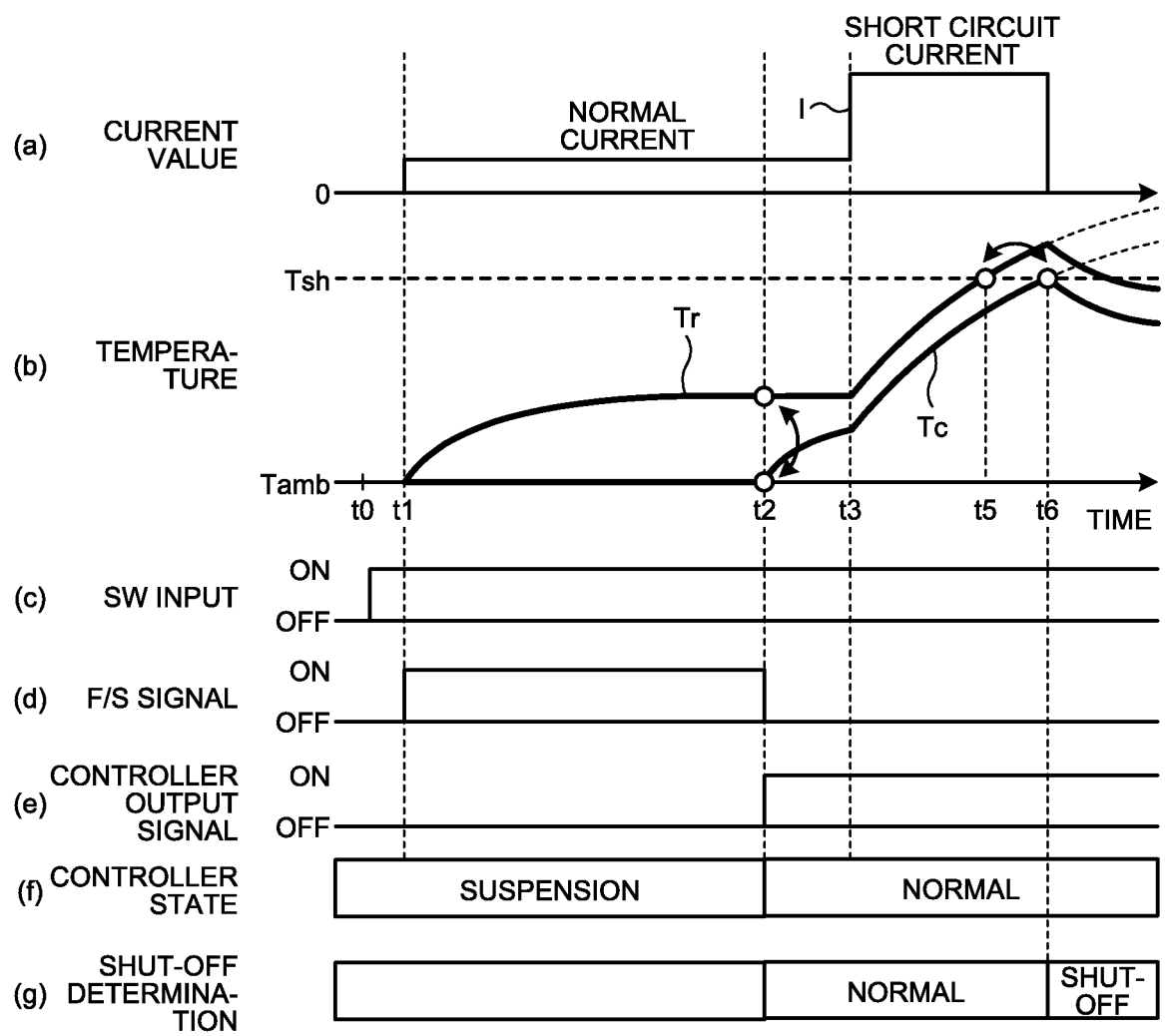

ELECTRIC-WIRE PROTECTION DEVICE

CROSS-REFERENCE TO RELATED APPLICATION(S)

The present application claims priority to and incorporates by reference the entire contents of Japanese Patent Application No. 2017-047362 filed in Japan on Mar. 13, 2017.

BACKGROUND OF THE INVENTION

1. Field of the Invention

The present invention relates to an electric-wire protection device.

2. Description of the Related Art

Conventionally, there has been a technique that calculates the temperature of an electric wire and shuts off a load circuit. Japanese Patent Application Laid-open No. 2007-295776 discloses the technique of a protection device for a load circuit that, when current flowing through a load is rising, calculates the rise in temperature of an electric wire based on the thermal characteristics (thermal resistance and thermal capacity) of the electric wire or a contact conductor and, when an arc occurs, calculates the temperature rise due to the arc and further, when the current flowing through the load is zero or is decreasing, calculates the fall in temperature of the electric wire based on the thermal characteristics of the electric wire.

On the technique of protecting an electric wire, there still is room for improvement. For example, if the estimated temperature of the electric wire falls below the actual temperature of the electric wire, the timing of shutting off the energization may be delayed. It is desired that the electric wire can be protected by appropriately conducting the temperature estimation of the electric wire.

SUMMARY OF THE INVENTION

An object of the present invention is to provide an electric-wire protection device capable of protecting the electric wire appropriately.

In order to achieve the above mentioned object, an electric-wire protection device according to one aspect of the present invention includes a voltage adjustment unit configured to adjust voltage from a power source side and supply the resulting voltage to a load; and a controller that includes a temperature calculation unit configured to calculate temperature information on an electric wire that couples the power source and the load from a value of current flowing through the voltage adjustment unit, and makes the voltage adjustment unit into a shut-off state in which the power source and the load are shut off based on the temperature information, wherein the temperature information is calculated from an amount of temperature changes based on the value of current and a predetermined initial value of the temperature information, the controller is configured to shift into a sleep state when a sleep condition is satisfied, the sleep condition including a condition that the temperature information is a value on a lower temperature side than the initial value, and the initial value when the controller returns from the sleep state is a value based on a convergence value of temperature of the electric wire in conducting energization on the electric wire at a maximum value of steady-state current.

According to another aspect of the present invention, in the electric-wire protection device, it is preferable that the controller makes the voltage adjustment unit into the shut-off state when the temperature information becomes a value on a higher temperature side than a predetermined threshold, and the initial value when the controller returns from the sleep state is a value on a lower temperature side than the threshold.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 2 is an explanatory diagram of shut-off determination in the embodiment;

FIG. 5 is a timing chart illustrating the operation of a comparative example.

DETAILED DESCRIPTION OF THE PREFERRED EMBODIMENT

The following describes in detail an electric-wire protection device according to an exemplary embodiment of the present invention with reference to the accompanying drawings. The invention, however, is not intended to be limited by the embodiment. The constituent elements in the following embodiment include those that a person skilled in the art can easily assume or that are substantially identical.

EMBODIMENT

Figure 1:
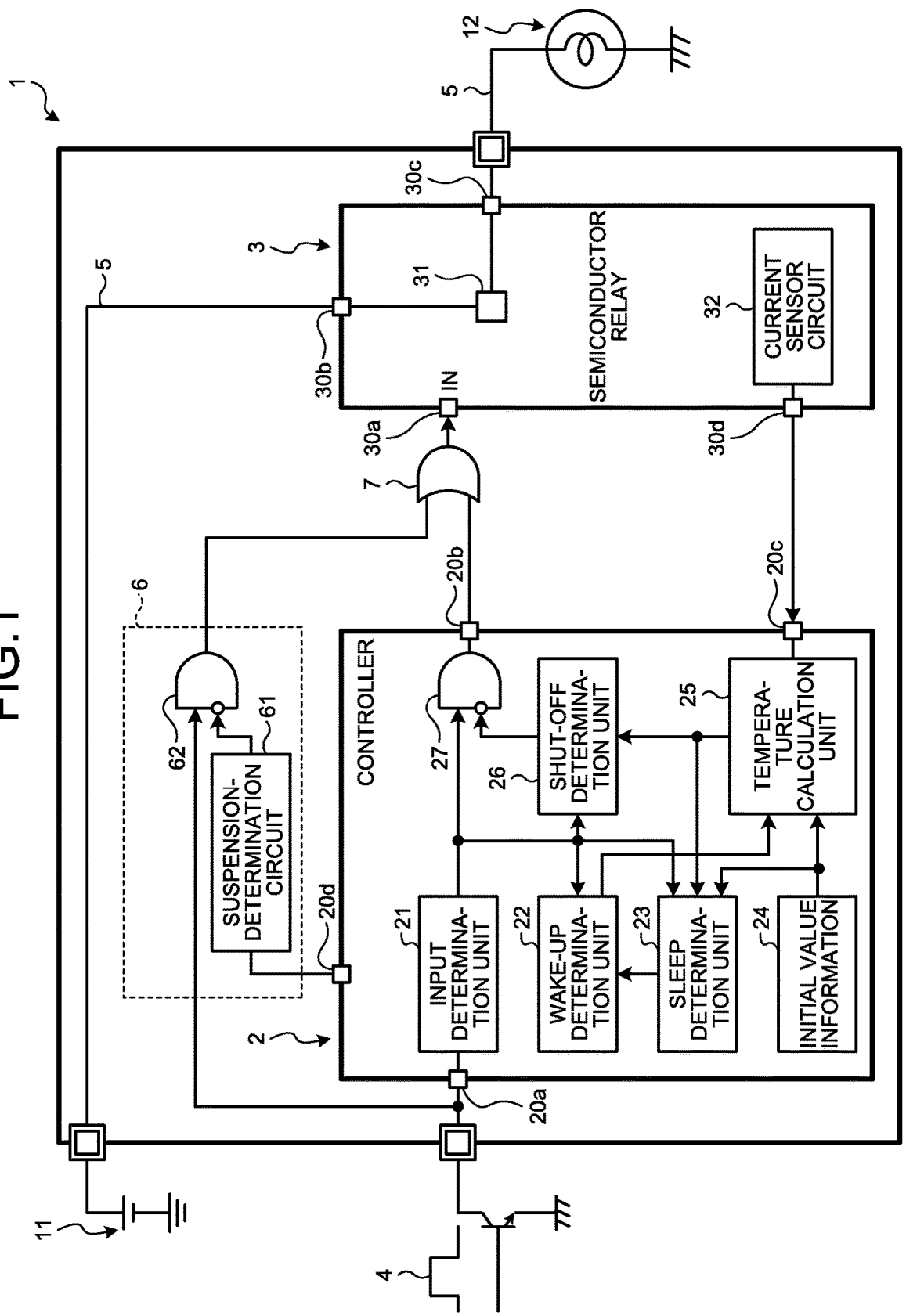
FIG. 1 is a diagram illustrating an electric-wire protection device according to an embodiment.
Figure 3:
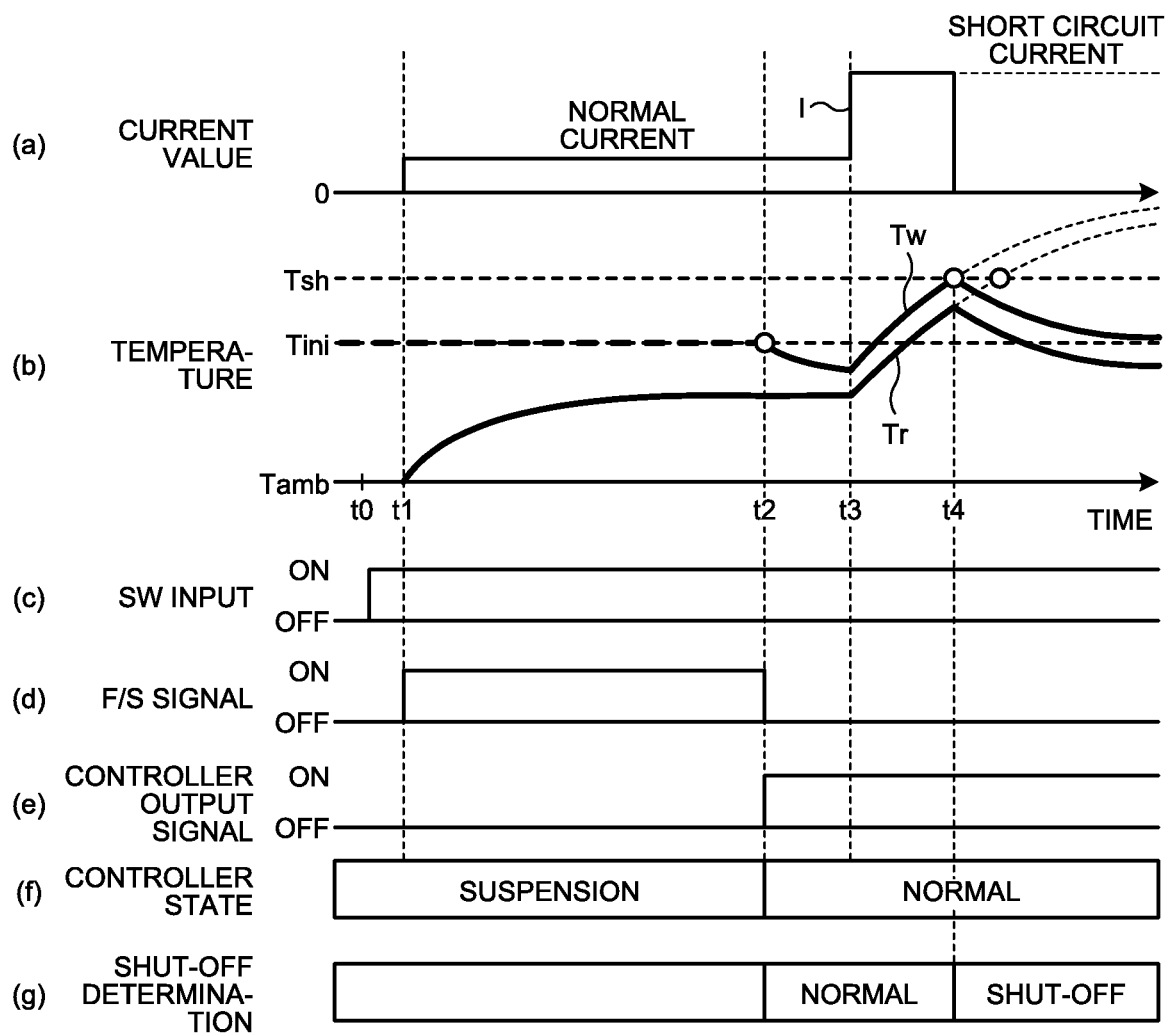
FIG. 3 is a timing chart illustrating the operation of the electric-wire protection device in the embodiment.
Figure 4:
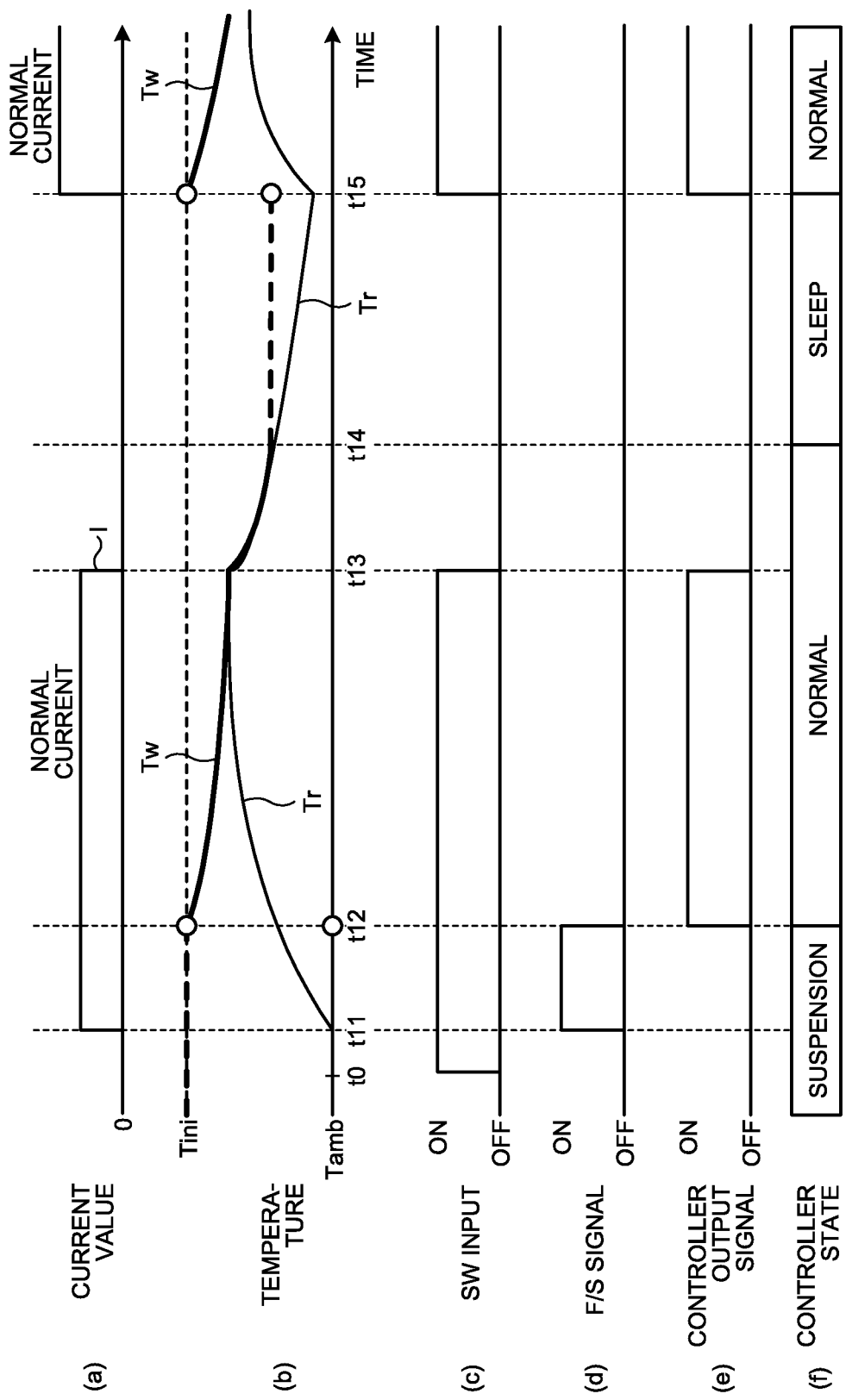
FIG. 4 is another timing chart illustrating the operation of the electric-wire protection device in the embodiment.

With reference to FIGS. 1 to 5, the exemplary embodiment will be described. The present embodiment relates to an electric-wire protection device. FIG. 1 is a diagram illustrating the electric-wire protection device according to the embodiment, FIG. 2 is an explanatory diagram of shut-off determination in the embodiment, FIG. 3 is a timing chart illustrating the operation of the electric-wire protection device in the embodiment, FIG. 4 is another timing chart illustrating the operation of the electric-wire protection device in the embodiment, and FIG. 5 is a timing chart illustrating the operation of a comparative example.

As illustrated in FIG. 1, an electric-wire protection device 1 according to the present embodiment includes a voltage adjustment unit 3, a controller 2, a fail-safe circuit 6, and an OR circuit 7. The electric-wire protection device 1 is installed in a vehicle and performs power supply to an electric load (hereinafter simply referred to as "load") 12 of the vehicle. Examples of the load 12 to which the electric power is supplied by the electric-wire protection device 1 include a lamp such as a headlight of the vehicle. The electric-wire protection device 1 controls a supply voltage to the load 12 by the voltage adjustment unit 3 and shuts off the power supply to the load 12 in a software manner. The electric-wire protection device 1 estimates, based on the value of current flowing through the voltage adjustment unit 3, a calorific value and a heat discharge of the electric wire and shuts off the power supply to the load 12 based on the estimated result. The following describes in detail the electric-wire protection device 1 in the present embodiment.

The voltage adjustment unit 3 in the present embodiment is a semiconductor relay that includes a signal input port 30*a*, an input unit 30*b*, an output unit 30*c*, a signal output port 30*d*, a semiconductor switching element 31, and a current sensor circuit 32. The signal input port 30*a* is electrically coupled to a control-signal output port 20*b* of the controller 2 via the OR circuit 7. The input unit 30*b* is electrically coupled to a power source 11 of the vehicle. The power source 11 is a secondary battery such as a battery, for example. The output unit 30*c* is electrically coupled to the load 12.

The semiconductor switching element 31 intervenes between the input unit 30*b* and the output unit 30*c*. The semiconductor switching element 31 conducts or suspends the power supply to the load 12 depending on an ON/OFF state of a control signal. The semiconductor switching element 31 is a metal-oxide-semiconductor field-effect transistor (MOSFET), for example. The voltage adjustment unit 3 performs duty control of the semiconductor switching element 31 by a control circuit not depicted. The duty control on the semiconductor switching element 31 is PWM control, for example. The control circuit determines a duty ratio of duty control based on an input voltage from the power source 11, and a target value of supply voltage to the load 12. The duty ratio is determined so as to make an effective voltage to the load 12 be the target value of the supply voltage.

The current sensor circuit 32 detects the value of current that flows via the semiconductor switching element 31. In other words, the current sensor circuit 32 detects the value of the current that flows to the load 12 from the power source 11 via the voltage adjustment unit 3. The signal indicating the detection result of the current sensor circuit 32 is output from the signal output port 30*d*. The signal output port 30*d* is electrically coupled to a current-signal input port 20*c* of the controller 2.

The controller 2 controls the operation and suspension of the voltage adjustment unit 3. The controller 2 is a control device or a control circuit such as a microcomputer, for example. The controller 2 includes an arithmetic unit, a storage unit, and a communication unit, and has a program and a circuit configuration for executing the operation of the present embodiment. The controller 2 includes a command-signal input port 20*a*, the control-signal output port 20*b*, the current-signal input port 20*c*, a watch-dog signal output port 20*d*, an input determination unit 21, a wake-up determination unit 22, a sleep determination unit 23, an initial-value storage unit 24, a temperature calculation unit 25, a shut-off determination unit 26, and a logic circuit 27.

The command-signal input port 20*a* is a port to which a command signal that causes the load 12 to operate is input. The control-signal output port 20*b* is a port that outputs a control signal to the voltage adjustment unit 3. The current-signal input port 20*c* is a port to which a signal on the current value detected by the current sensor circuit 32 is input. The watch-dog signal output port 20*d* is a port that outputs a watch-dog signal. The controller 2 outputs the watch-dog signal from the watch-dog signal output port 20*d* on a regular basis.

The command-signal input port 20*a* is electrically coupled to a switch 4 installed in the vehicle. The switch 4 is operated by a driver of the vehicle, for example. When operating input to cause the load 12 to operate is made on the switch 4, the switch 4 is switched to an operation command state from a suspension command state. The switching of the suspension command state and the operation command state in the switch 4 is the switching of grounding and non-grounding, for example. The switch 4 on which the operating input of an operation command has been made maintains the operation command state until the operating input for operation stop is made.

The input determination unit 21 is electrically coupled to the command-signal input port 20*a*. The input determination unit 21 outputs a signal corresponding to the state of the switch 4. More specifically, the input determination unit 21, when the switch 4 is in the operation command state, outputs an ON signal and, when the switch 4 is in the suspension command state, outputs an OFF signal.

The wake-up determination unit 22 detects that the controller 2 has moved into a normal operation from a suspension state. The suspension state of the controller 2 includes a sleep state, and a state of operation suspension due to a drop in a power supply voltage. The wake-up determination unit 22 determines, based on an output signal of the sleep determination unit 23 and the watch-dog signal, whether the controller 2 has moved into the normal operation, for example. The wake-up determination unit 22 outputs a wake-up ON signal when detected that the controller 2 has moved into the normal operation. Meanwhile, the wake-up determination unit 22 outputs a wake-up OFF signal when detected the suspension state of the controller 2. The output signal of the wake-up determination unit 22 is sent to the temperature calculation unit 25.

The sleep determination unit 23 determines whether a sleep condition is satisfied. The sleep condition in the present embodiment is that the output signal of the input determination unit 21 is OFF and that an estimated temperature Tw of an electric wire 5, which will be described later, is a value on a lower temperature side than a sleep threshold Tslp. The condition concerning the temperature may be "Estimated temperature Tw Sleep threshold Tslp". The sleep threshold Tslp is an initial value Tini, which will be described later, for example. The sleep determination unit 23 outputs a sleep ON signal when the sleep condition is satisfied. Meanwhile, when the sleep condition is not satisfied, the sleep determination unit 23 outputs a sleep OFF signal. The output signal of the sleep determination unit 23 is sent to the wake-up determination unit 22. The controller 2 moves into the sleep state when the sleep ON signal is output from the sleep determination unit 23. In the sleep state, the input determination unit 21 and the wake-up determination unit 22 operate. In the sleep state, at least the temperature calculation unit 25 and the shut-off determination unit 26 suspend the operation.

The initial-value storage unit 24 stores therein the initial value Tini of temperature information about the electric wire 5. The initial value Tini stored in the initial-value storage unit 24 is sent to the sleep determination unit 23 and the temperature calculation unit 25.

The temperature calculation unit 25 is a circuit or an arithmetic unit that calculates the temperature of the electric wire 5. The electric wire 5 that is an object of temperature calculation by the temperature calculation unit 25 is the electric wire 5 that couples the power source 11 and the voltage adjustment unit 3, or the electric wire 5 that couples the voltage adjustment unit 3 and the load 12. The temperature calculation unit 25 is electrically coupled to the current-signal input port 20*c*. The temperature calculation unit 25 acquires a signal indicating the current value detected by the current sensor circuit 32. The temperature calculation unit 25 acquires the initial value Tini used for temperature calculation from the initial-value storage unit 24.

The way of thinking in the temperature calculation by the temperature calculation unit 25 in the present embodiment will be described with reference to the following Expression 1 to Expression 4. In Expression 1 to Expression 4, the Pcin represents exothermic energy per unit time (J/s) of the electric wire 5, the Pcout represents heat radiation energy per unit time (J/s) of the electric wire 5, the rc represents a conductor resistance (Ω) of the electric wire 5, the I represents a flowing current (A), the Cth represents thermal capacity (J/° C.) of the electric wire 5, the Rth represents thermal resistance (° C./W) of the electric wire 5, the Qc(n) represents calorific value (cumulative value) of the electric wire 5 when the n-th current value is sampled, the Δt represents sampling time (sampling interval) (s), and the ΔT represents the amount of temperature changes (cumulative value) (° C.) of the electric wire 5.

$$Pcin = rc \times I^2 \quad \text{Expression 1}$$

$$Pcout = Qc(n-1)/(Cth \times Rth) \quad \text{Expression 2}$$

$$Qc(n) = Qc(n-1) + (Pcin - Pcout) \times \Delta t \quad \text{Expression 3}$$

$$\Delta T = Qc(n)/Cth \quad \text{Expression 4}$$

The temperature calculation unit 25 calculates, at regular time intervals, temperature information from the information on the current value acquired from the current sensor circuit 32. The temperature calculation unit 25 outputs the calculated temperature information to the shut-off determination unit 26. The temperature information in the present embodiment is the information on the present temperature, the amount of temperature changes, heat balance, and others of the electric wire 5. The controller 2 makes, based on the temperature information, the voltage adjustment unit 3 into a shut-off state and shuts off the power source 11 and the load 12. The shut-off state is a state in which the power supply to the load 12 is continuously suspended in the voltage adjustment unit 3 and in which the duty control is not performed.

The temperature information in the present embodiment is an estimated value of present temperature of the electric wire 5. In the following description, the present temperature of the electric wire 5 calculated by the temperature calculation unit 25 is simply referred to as "estimated temperature Tw". The estimated temperature Tw is the present temperature of the electric wire 5 estimated by the temperature calculation unit 25. In the present embodiment, the estimated temperature Tw of the electric wire 5 is calculated as a sum of the initial value Tini stored in the initial-value storage unit 24 and the amount of temperature changes ΔT.

The shut-off determination unit 26 performs shut-off determination based on the signal of the input determination unit 21 and the estimated temperature Tw (temperature information) acquired from the temperature calculation unit 25. The shut-off determination unit 26 outputs a signal indicating the determination result to the logic circuit 27. The shut-off determination unit 26 performs the shut-off determination as illustrated in FIG. 2, for example. In FIG. 2, illustrated are the signal (SW) of the input determination unit 21, the estimated temperature Tw, and the content of shut-off determination made by the shut-off determination unit 26. The shut-off determination unit 26 outputs an ON signal if the input determination unit 21 is outputting an ON signal and the estimated temperature Tw is greater (HI) than or equal to a predetermined shut-off temperature Tsh. This ON signal is a shut-off command that makes the voltage adjustment unit 3 into a shut-off state. Meanwhile, the shut-off determination unit 26 outputs an OFF signal if the input determination unit 21 is outputting an ON signal and the estimated temperature Tw is below (LOW) the shut-off temperature Tsh. This OFF signal is a normal command that permits the voltage adjustment unit 3 to supply electricity to the load 12.

The shut-off determination unit 26 maintains the content of the shut-off determination until the signal of the input determination unit 21 is reset. In other words, after determining to make the voltage adjustment unit 3 into a shut-off state, the shut-off determination unit 26 continues to output the ON signal until the signal of the input determination unit 21 is made into OFF once and is made into ON again. Furthermore, when the signal of the input determination unit 21 is switched from ON to OFF in a state that the shut-off determination unit 26 is outputting an OFF signal, the shut-off determination unit 26 continues to output the OFF signal until the signal of the input determination unit 21 is made into ON again.

The logic circuit 27 outputs a control signal in response to the signal of the input determination unit 21 and the signal of the shut-off determination unit 26. The output signal of the shut-off determination unit 26, with its ON/OFF state inverted, is input to the logic circuit 27. That is, an ON signal of the shut-off determination unit 26 is inverted into an OFF signal and is input to the logic circuit 27, and an OFF signal of the shut-off determination unit 26 is inverted into an ON signal and is input to the logic circuit 27. The logic circuit 27 is an AND circuit. The logic circuit 27, when the output signal of the input determination unit 21 is ON and the shut-off determination unit 26 is outputting an OFF signal, outputs an ON signal from the control-signal output port 20*b*. The ON signal that the logic circuit 27 outputs is a supply-command signal that commands the execution of supplying electric power to the load 12.

Meanwhile, when the output signal of the input determination unit 21 is OFF or when the shut-off determination unit 26 is outputting an ON signal, the logic circuit 27 outputs an OFF signal from the control-signal output port 20*b*. The OFF signal that the logic circuit 27 outputs is a suspension-command signal that commands the suspension of supplying the electric power to the load 12. The suspension-command signal that is output from the logic circuit 27 while the shut-off determination unit 26 is outputting an ON signal functions as a shut-off command signal that makes the voltage adjustment unit 3 into a shut-off state and protects the electric wire 5. As the voltage adjustment unit 3 continuously shuts off the power source 11 and the load 12 in response to the suspension-command signal, the energization to the electric wire 5 is suspended and the heat generation in the electric wire 5 is suspended. As a result, a further rise in temperature of the electric wire 5 is suppressed.

The fail-safe circuit 6 controls the voltage adjustment unit 3 in place of the controller 2 when the controller 2 fails to operate normally. The fail-safe circuit 6 includes a suspension-determination circuit 61 and a logic circuit 62. The suspension-determination circuit 61 performs suspension determination of the controller 2 based on the watch-dog signal output from the watch-dog signal output port 20*d*. The suspension-determination circuit 61 counts a predetermined fixed period by a timer. The suspension-determination circuit 61 resets the timer when the watch-dog signal is received from the controller 2 before counting up the fixed period. The suspension-determination circuit 61 outputs an ON signal unless counting up the fixed period. Meanwhile, the suspension-determination circuit 61 outputs an OFF signal when the timer counts up the fixed period.

The logic circuit 62 outputs a signal that corresponds to the output signal of the switch 4 and the output signal of the suspension-determination circuit 61. The output signal of the suspension-determination circuit 61, with its ON/OFF state inverted, is input to the logic circuit 62. That is, an ON signal of the suspension-determination circuit 61 is inverted into an OFF signal and is input to the logic circuit 62, and an OFF signal of the suspension-determination circuit 61 is inverted into an ON signal and is input to the logic circuit 62. The logic circuit 62 is an AND circuit. The logic circuit 62, when the output signal of the switch 4 is ON and the suspension-determination circuit 61 is outputting an OFF signal, outputs a fail-safe ON signal. The fail-safe ON signal is a supply-command signal that commands the voltage adjustment unit 3 to supply electric power to the load 12.

Meanwhile, when the output signal of the switch 4 is OFF or when the suspension-determination circuit 61 is outputting an ON signal, the logic circuit 62 outputs a fail-safe OFF signal. The output of the logic circuit 62 and the output of the logic circuit 27 are input to the OR circuit 7. The OR circuit 7 outputs an ON signal when at least one of the output of the logic circuit 27 and the output of the logic circuit 62 is ON. Accordingly, when an ON signal is not output from the logic circuit 27 due to the abnormality of the controller 2 even though the switch 4 is outputting an ON signal, the fail-safe circuit 6 outputs a supply-command signal to the voltage adjustment unit 3.

In the present embodiment, the initial value Tini that the temperature calculation unit 25 uses for the calculation of the estimated temperature Tw is determined as described below so that the electric wire 5 can be protected appropriately. Specifically, the initial value Tini of the present embodiment is a convergence temperature of the electric wire 5 when energization is conducted at a maximum value Imax of steady-state current. The maximum value Imax of steady-state current is a maximum value in the range of current at which steady energization is permitted in the load 12. The maximum value Imax of steady-state current is determined in the following manner, for example.

The maximum value Imax of steady-state current is a value based on the specification, international standards, and technical standards of the load 12, for example. It is assumed that, for example, a maximum value of operating voltage of the load 12 is 18 V and the variation in load rating is ±20%. If the load 12 is a lamp of a load rating of 60 W, the maximum value Imax of steady-state current is a current value 1.2 times the current value of the current that flows through the lamp of 60 W at the supply voltage of 18 V. When a maximum value of current that flows through the load 12 is determined by the international standards or the technical standards, this maximum value may be the maximum value Imax of steady-state current. The maximum value Imax of steady-state current may be a maximum current value by the voltage in the operating voltage range determined by the above-described standards.

The initial value Tini is the temperature of the electric wire 5 at the time that the temperature of the electric wire 5 converges (hereinafter simply referred to as "convergence temperature Tv") while the electricity is supplied to the load 12 at the maximum value Imax of steady-state current. In other words, the initial value Tini is the temperature of the electric wire 5 at the time that the calorific value and the heat discharge balance out in the electric wire 5 while the maximum value Imax of the steady-state current is flowing through the electric wire 5. The environmental temperature in calculation of the convergence temperature Tv is defined appropriately depending on the environment of the place where the electric wire 5 is arranged.

The temperature calculation unit 25 sets the initial value Tini as the estimated temperature Tw when starting or resuming the calculation of the estimated temperature Tw of the electric wire 5. In other words, the calculation of the estimated temperature Tw is started with the initial value Tini as a starting point. The electric-wire protection device 1 of the present embodiment can, by using the initial value Tini, protect the electric wire 5 appropriately as described below.

In the timing chart in FIG. 3, illustrated are (a) a current value, (b) temperature, (c) input from the switch 4, (d) a fail-safe signal, (e) an output signal of the controller 2, (f) the state of the controller 2, and (g) a result of shut-off determination. (a) The current value I indicated in the section of the current value is a value of current supplied to the load 12 via the electric wire 5. (b) In the section of the temperature, the estimated temperature Tw by the temperature calculation unit 25 and the actual temperature Tr of the electric wire 5 are indicated. (d) The fail-safe signal is the output signal of the logic circuit 62. (e) The output signal of the controller 2 is the output signal of the control-signal output port 20b of the controller 2.

In FIG. 3, at the time t0, the switch 4 is switched from OFF to ON. If the controller 2 remains suspending due to the abnormality or malfunction of the controller 2, at the time t1 that is the time a fixed period has elapsed, the fail-safe signal becomes ON. As the fail-safe ON signal is output, the energization is started at t1 and the actual temperature Tr of the electric wire 5 starts to rise from the ambient temperature Tamb. At the time t2, the controller 2 starts up and the controller 2 starts to calculate the estimated temperature Tw. At this time, the controller 2 sets the initial value Tini as the estimated temperature Tw. The initial value Tini is the convergence temperature Tv of the electric wire 5 when the energization is conducted at the maximum value Imax of steady-state current as described above. Accordingly, the initial value Tini is a temperature greater than or equal to the actual temperature Tr of the electric wire 5. As a result, the estimated temperature Tw subsequent to the time t2 changes at a value that is equal to the actual temperature Tr or higher than the actual temperature Tr.

At the time t3, a short circuit occurs in the circuit, and a short circuit current starts to flow through the electric wire 5. At the time t4, the estimated temperature Tw reaches the shut-off temperature Tsh. In response to the fact that the estimated temperature Tw has become greater than or equal to the shut-off temperature Tsh, the result of the shut-off determination by the shut-off determination unit 26 is switched from "normal" to "shut-off". As a result, the voltage adjustment unit 3 shifts into a shut-off state, and the energization is suspended. At this time, the actual temperature Tr is at a temperature lower than the estimated temperature Tw. Accordingly, the electric wire 5 is protected appropriately. The broken lines subsequent to the time t4 in the estimated temperature Tw and the actual temperature Tr indicate the changes in temperature when the energization was not suspended.

The effect of the electric-wire protection device 1 of the present embodiment will be described with reference to a comparative example illustrated in FIG. 5. In FIG. 5, an estimated temperature Tc of the comparative example is illustrated in place of the estimated temperature Tw of the present embodiment. When the calculation of the estimated temperature Tc of the comparative example is started, the ambient temperature Tamb is set as the estimated temperature Tc of the comparative example. At the time t2, the controller 2 starts up and starts to calculate the estimated temperature Tc of the comparative example. At this time, the controller 2 sets the ambient temperature Tamb as the estimated temperature Tc of the comparative example. The ambient temperature Tamb is an actually measured value, for example. Because the actual temperature Tr has risen while the controller 2 is suspending, the actual temperature Tr at the time t2 is a value higher than the ambient temperature Tamb.

At the time t3, a short circuit current starts to flow, and at the time t5, the actual temperature Tr reaches the shut-off temperature Tsh. However, because the estimated temperature Tc of the comparative example at this time point is a temperature lower than the shut-off temperature Tsh, the determination result by the shut-off determination unit 26 is "normal". At the time t6, the estimated temperature Tc of the comparative example reaches the shut-off temperature Tsh and the determination result by the shut-off determination unit 26 is switched to "shut-off". The actual temperature Tr at this time has already been a temperature higher than the shut-off temperature Tsh. As described above, the timing of shutting off the energization may be delayed in the comparative example.

Meanwhile, in the electric-wire protection device 1 of the present embodiment, the estimated temperature Tw reaches the shut-off temperature Tsh before the actual temperature Tr reaches the shut-off temperature Tsh. Thus, the electric-wire protection device 1 of the present embodiment can protect the electric wire 5 and the load 12 appropriately.

Next, with reference to FIG. 4, the operation at the time that the controller 2 returns from a sleep state will be described. In FIG. 4, at the time t0, the switch 4 is switched from OFF to ON. Because the controller 2 remains suspending, at the time t11, the fail-safe signal becomes ON, and the supply of electricity to the load 12 is started. At the time t12, as the controller 2 starts up, the output signal of the controller 2 becomes ON and the fail-safe signal is switched to OFF. At the time t12, the calculation of the estimated temperature Tw is started and the initial value Tini is set as the estimated temperature Tw. The estimated temperature Tw declines from the initial value Tini. At the time t13, the switch 4 is switched from ON to OFF, and the power supply to the load 12 is suspended. As the energization of the electric wire 5 is suspended, both the estimated temperature Tw and the actual temperature Tr decline. At the time t14, as the sleep condition is satisfied, the controller 2 shifts into the sleep state.

At the time t15, the switch 4 is made into ON, and the controller 2 returns to a normal operating state from the sleep state. The temperature calculation unit 25, when returning from the sleep state at the time t15 and resuming the calculation of the estimated temperature Tw, sets the initial value Tini as the estimated temperature Tw. Accordingly, the electric-wire protection device 1 of the present embodiment can resume the calculation of the estimated temperature Tw by setting a value that is greater than or equal to the actual temperature Tr as the estimated temperature Tw at the time of returning from the sleep state. In the present embodiment, the sleep condition includes a condition under which the calculated temperature information (typically the estimated temperature Tw) is a value on the lower temperature side than the initial value Tini. Accordingly, the actual temperature Tr of the electric wire 5 is the temperature on the lower temperature side than the initial value Tini in the sleep state. Thus, the estimated temperature Tw at the time of returning from the sleep state is kept from becoming a value on the lower temperature side than the actual temperature Tr.

As described above, the electric-wire protection device 1 of the present embodiment includes the voltage adjustment unit 3 and the controller 2. The voltage adjustment unit 3 adjusts the voltage from the power source 11 side and supplies the resulting voltage to the load 12. The controller 2 includes the temperature calculation unit 25 and makes the voltage adjustment unit 3 into a shut-off state based on the temperature information. The temperature calculation unit 25 calculates the temperature information on the electric wire 5 that couples the power source 11 and the load 12 from a value of current flowing through the voltage adjustment unit 3. The temperature information is calculated from the amount of temperature changes ΔT based on the current value, and the predetermined initial value Tini of the temperature information. The controller 2 shifts into the sleep state when the sleep condition is satisfied, the sleep condition including a condition that the temperature information is a value on the lower temperature side than the initial value Tini.

The initial value Tini when the controller 2 returns from the sleep state is a value based on the convergence value of temperature of the electric wire 5 in conducting the energization on the electric wire 5 at the maximum value Imax of steady-state current. In the electric-wire protection device 1 of the present embodiment, because the calculation of the estimated temperature Tw is started from the initial value Tini when the controller 2 returns from the sleep state, the estimated temperature Tw is kept from becoming a value on the lower temperature side than the actual temperature Tr. Thus, the electric-wire protection device 1 can appropriately protect the electric wire 5 from an excessive temperature rise. Furthermore, the electric-wire protection device 1 of the present embodiment can protect the electric wire 5 appropriately without having to calculate the temperature information in the sleep state. Accordingly, the calculation of the temperature information by the temperature calculation unit 25 can be kept suspended in the sleep state, and the reduction in power consumption can be achieved.

In the electric-wire protection device 1 in the present embodiment, the controller 2 makes the voltage adjustment unit 3 into a shut-off state, when the temperature information becomes a value on a higher temperature side than the shut-off temperature Tsh that is a predetermined threshold. The initial value Tini when the controller 2 returns from the sleep state is a value on the lower temperature side than the shut-off temperature Tsh. As the initial value Tini in returning from the sleep state is to be a value on the lower temperature side than the shut-off temperature Tsh, the estimated temperature Tw is kept from reaching the shut-off temperature Tsh due to the flow of inrush current at the time of energization start. A margin provided between the initial value Tini and the shut-off temperature Tsh is determined depending on the amount of rise of the estimated temperature Tw due to the inrush current, for example.

Modifications of Embodiment

Modifications of the embodiment will be described. The initial value Tini is not limited to the same value as the convergence temperature Tv. The initial value Tini may be a value that is provided with a margin of a certain ratio or a margin of a certain width with respect to the convergence temperature Tv. For example, the initial value Tini may be a higher temperature side value and higher by M % with respect to the convergence temperature Tv, or a lower temperature side value and lower by M % with respect to the convergence temperature Tv. The above-described M % may be a value of 20%, 10%, or 5%, for example.

The initial value Tini when the controller 2 returns from the sleep state may be different from the initial value Tini of cases other than that. The initial value Tini in returning from the sleep state is referred to as "TiniA" and the initial value Tini of the cases other than that is referred to as "TiniB". The initial value TiniB may be a value on the lower temperature side than the initial value TiniA.

The sleep condition is not limited to the one illustrated in the embodiment. The sleep condition may include a condition that the estimated temperature Tw is below the sleep threshold Tslp continues for a certain time. The sleep condition may include a condition that a certain time has elapsed after switching the switch 4 to OFF. The sleep condition may include other conditions.

In the electric-wire protection device 1, the means to adjust the voltage from the power source 11 side and to supply it to the load is not limited to the semiconductor switching element. The semiconductor switching element 31 is not limited to the MOSFET. Other switching elements may be used for the semiconductor switching element 31. The load 12 is not limited to the lamp. The load 12 may be an electric load other than the lamp.

The temperature information calculated by the temperature calculation unit 25 is not limited to the estimated temperature Tw of the electric wire 5. The temperature information is the information on the temperature of the electric wire 5 or the information on physical quantity related to the temperature of the electric wire 5. The temperature information to which the controller 2 refers in the shut-off determination may be the amount of temperature changes ΔT, or a calorific value Qc, for example.

The disclosed content in the above-described embodiment and the modifications can be implemented in combination as appropriate.

An electric-wire protection device according to the present embodiment includes a voltage adjustment unit that adjusts the voltage from a power source side and supplies the resulting voltage to a load, and a controller that includes a temperature calculation unit configured to calculate temperature information on an electric wire that couples the power source and the load from a value of current flowing through the voltage adjustment unit, and makes the voltage adjustment unit into a shut-off state in which the power source and the load are shut off based on the temperature information. The temperature information is calculated from the amount of temperature changes based on the current value and a predetermined initial value of the temperature information. The controller shifts into a sleep state when a sleep condition is satisfied, the sleep condition including a condition that the temperature information is a value on the lower temperature side than the initial value. The initial value when the controller returns from the sleep state is a value based on a convergence value of temperature of the electric wire in conducting energization on the electric wire at a maximum value of steady-state current. The electric-wire protection device in the embodiment has an advantageous effect in that the temperature information calculated by the temperature calculation unit is kept from falling below the actual temperature of the electric wire, and in that the electric wire can be protected appropriately.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electric-wire protection device comprising:
   a voltage adjustment unit configured to adjust voltage from a power source side and supply the resulting voltage to a load; and
   a controller that includes a temperature calculation unit configured to calculate temperature information on an electric wire that couples the power source and the load from a value of current flowing through the voltage adjustment unit, and makes the voltage adjustment unit into a shut-off state in which the power source and the load are shut off based on the temperature information, wherein
   the temperature information is calculated from an amount of temperature changes based on the value of current and a predetermined initial value of the temperature information,
   the controller is configured to shift into a sleep state when a sleep condition is satisfied, the sleep condition including a condition that the temperature information is a value on a lower temperature side than the initial value, and
   the initial value when the controller returns from the sleep state is a value based on a convergence value of temperature of the electric wire in conducting energization on the electric wire at a maximum value of steady-state current.

2. The electric-wire protection device according to claim 1, wherein
   the controller makes the voltage adjustment unit into the shut-off state when the temperature information becomes a value on a higher temperature side than a predetermined threshold, and
   the initial value when the controller returns from the sleep state is a value on a lower temperature side than the threshold.

* * * * *